United States Patent [19]

Ogasawara et al.

[11] 4,362,956

[45] Dec. 7, 1982

[54] ABSOLUTE VALUE CIRCUIT

[75] Inventors: Akira Ogasawara, Yokohama; Ryuzo Motoori, Kawasaki, both of Japan

[73] Assignee: Nippon Kogaku K.K., Japan

[21] Appl. No.: 203,903

[22] Filed: Nov. 4, 1980

[30] Foreign Application Priority Data

Nov. 22, 1979 [JP] Japan ............................... 54-151468

[51] Int. Cl.[3] ............................................. H03K 5/24

[52] U.S. Cl. ................................... 307/355; 307/261; 328/26; 328/158

[58] Field of Search ............... 307/261, 262, 355, 491, 307/494; 328/26, 158, 159

[56] References Cited

U.S. PATENT DOCUMENTS 4,069,460 1/1978 Sauer .................................. 307/262

4,158,882 6/1979 Citta ..................................... 328/26

*Primary Examiner*—John Zazworsky

*Attorney, Agent, or Firm*—Shapiro and Shapiro

[57] ABSTRACT

An absolute value circuit capable of providing, through an output terminal, a signal corresponding to the absolute value of the difference between a first input signal and a second input signal, comprises a first circuit, a second circuit and a uni-directional circuit.

The first circuit is adapted for subtracting a current corresponding to said second input signal from a current corresponding to said first input signal and for supplying to said output terminal a current of one direction corresponding to the result of said subtraction in case said result is positive, or a current of the other direction corresponding to the result of said subtraction in case said result is negative.

The second circuit is adapted for subtracting a current corresponding to said first input signal from a current corresponding to said second input signal and for supplying to said output terminal a current of one direction corresponding to the result of said subtraction in case said result is positive, or a current of the other direction corresponding to the result of said subtraction in case said result is negative.

The uni-directional circuit is adapted for transmitting either one of said current of said one direction and said current of said the other direction supplied from said first and second circuit.

6 Claims, 4 Drawing Figures

ABSOLUTE VALUE CIRCUIT

BACKGROUND OF THE INVENTION

1. Field of the Invention

The present invention relates to an absolute value circuit composed of semi-conductor elements.

2. Description of the Prior Art

A conventionally known absolute value circuit is designed with operational amplifiers and is usually composed of two operational amplifiers with several external resistors. Such circuit, however, could not successfully be incorporated in a one-chip integrated circuit because of the excessively large circuit scale and of the large load power consumption resulting from the limitation on the resistance which can be incorporated in such integrated circuit.

SUMMARY OF THE INVENTION

The object of the present invention is to provide an absolute value circuit of a novel composition capable of providing an output signal proportional to the absolute value of the difference between input voltages.

Another object of the present invention is to provide an absolute value circuit which is not associated with the above-mentioned drawbacks, is of a circuit scale suitable for incorporation in an integrated circuit and is featured in a reduced power consumption.

DESCRIPTION OF THE PREFERRED EMBODIMENTS

Figure 1:
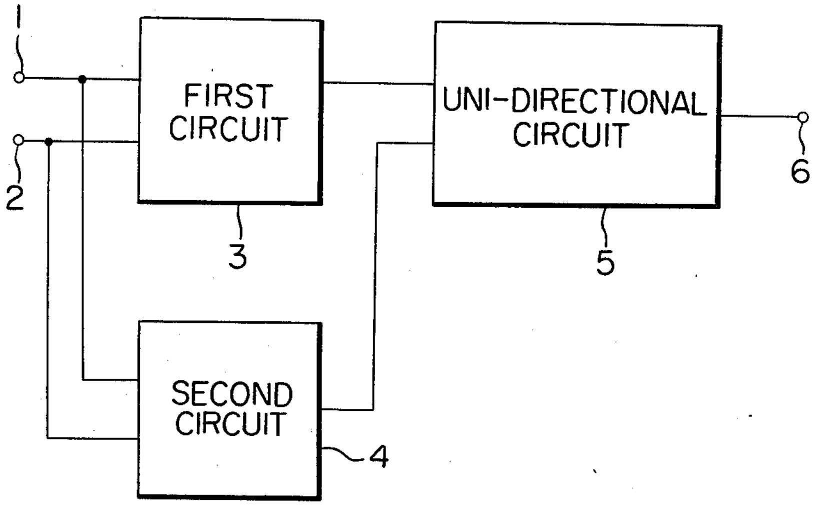
FIG. 1 is a block diagram showing the fundamental circuit structure of the present invention.

FIG. 1 shows the basic circuit structure of the present invention, wherein a first circuit 3 generates a first current corresponding to a first input signal entered on a first input terminal 1 and a second current corresponding to a second input signal entered on a second input terminal 2, and thus supplies a uni-directional circuit means 5 with a difference current, corresponding to the difference of said first and second currents, of one direction or the other respectively when said first current is larger or smaller than said second current. Similarly a second circuit 4 generates a first current and a second current respectively corresponding to the first and second input signals, and supplies said uni-directional circuit means 5 with a difference current of said one direction or the other respectively when said first current is smaller or larger than said second current. Said uni-directional circuit means 5 only transmits the output current from said first and second circuits of a predetermined direction to an output terminal 6. In case said predetermined direction corresponds to the aforementioned one direction, the unidirectional circuit means 5 transmits to said output terminal 6 the difference current (difference signal) of said one direction from said first circuit when the first input signal is larger than the second input signal, namely when the first current is larger than the second current, and transmits the difference current (difference signal) of said one direction from said second circuit when the second input signal is larger than the first input signal. An absolute value circuit is formed in this manner, as the output terminal 6 receives the difference signal of said one direction regardless whether the first signal is larger or smaller than the second signal.

Figure 2:
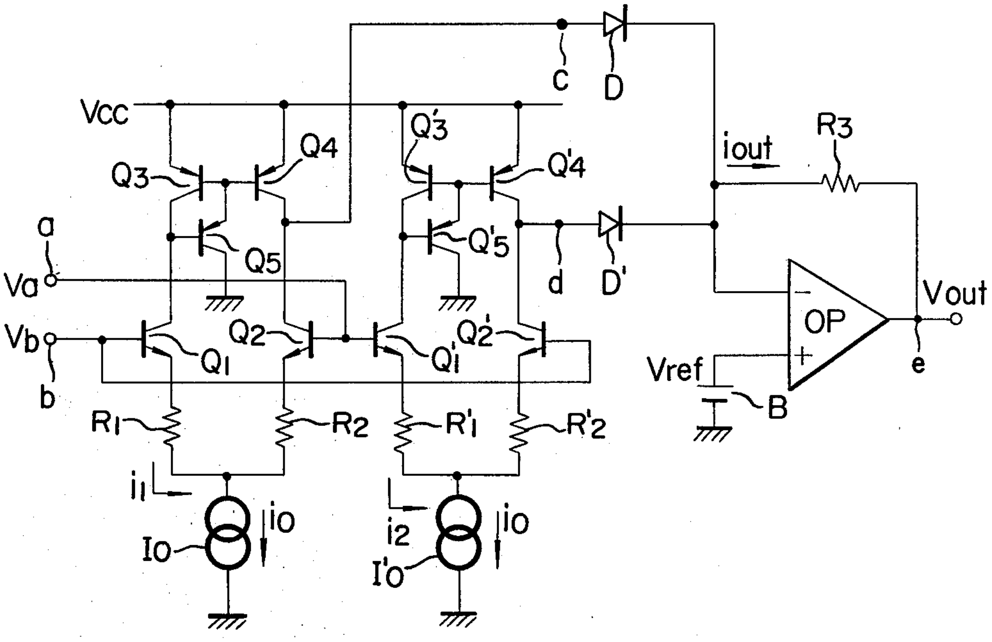
FIG. 2 is a circuit diagram of an embodiment of the present invention.

FIG. 2 shows, in a circuit diagram, an embodiment of the present invention shown in FIG. 1.

In the circuit in FIG. 2, transistors Q1, Q2, constituting first and second amplifiers, and resistors R1, R2 constitute a first differential amplifier biased by a constant current source $I_0$. A first current mirror circuit composed of transistors Q3, Q4 and Q5 is connected between the collectors of said transistors Q1, Q2 and a power supply line $V_{cc}$ to constitute a load to said differential amplifier, wherein said transistors Q3, Q5 form a current master circuit while said transistor Q4 forms a current slave circuit in such a manner as to obtain a current in said slave circuit that is the same as that in said master circuit. Similarly, transistors Q1', Q2' and resistors R1', R2' constitute a second differential amplifier biased by a constant current source $I_0'$, and a second current mirror circuit composed of transistors Q3', Q4' and Q5' is connected as a load to said second differential amplifier. A first input terminal a is connected to the bases of the transistors Q2 and Q1' while a second input terminal b is connected to the bases of the transistors Q1 and Q2', and a first output terminal c is connected to the junction between the collectors of the transistors Q2 and Q4 while a second output terminal d is connected to the junction between the collectors of the transistors Q2' and Q4'. Connected to said first and second output terminals c, d are diodes D, D' constituting uni-directional circuit means for transmitting the current from the transistors Q4, Q4' functioning as the current slave circuits of the first and second current mirror circuits. Said diodes D, D' are connected to the inverting input terminal of a succeeding operational amplifier (OP), of which the non-inverting input terminal is connected to a standard voltage source B. Said inverting input terminal is also connected to an output terminal e through a feedback resistor R3.

In the foregoing explanation, any component indicated by a primed number corresponds to and is the same as a component indicated by the same but unprimed number. For example, the constant current sources $I_0$ and $I_0'$ respectively provide the same current $i_0$. Also resistors R1 and R1' have the same resistance, and resistors R2 and R2' have the same resistance. (In the present embodiment, R1=R1'=R2=R2'=r). Also transistors Q1 and Q1' have the same parameters, and transistors Q2 and Q2' have the same parameters. (In the present embodiment, all the transistors Q1, Q1', Q2 and Q2' have the same parameters).

Now, in the following, there will be explained the function of the absolute value circuit of the present embodiment.

In the first differential amplifier, in case the first and second input terminals a, b receive the same input signals Va, Vb (Va=Vb), the current $i_0$ from the constant current source $I_0$ is equally divided as $0.5i_0$ in the left-hand branch circuit containing the transistor Q1 and the resistor R1, and as $0.5i_0$ in the right-hand branch circuit containing the transistor Q2 and the resistor R2, thus giving the same currents to the transistors Q3, Q4 and Q3', Q4' in the current mirror circuits. However this balance is broken when $Va \neq Vb$. It is now assumed that the current in the left-hand branch circuit and the current in the right-hand branch circuit in such unbalanced state are respectively represented by $i_1=(0.5+\alpha)i_0$ and $i_2=(0.5-\alpha)i_0$, wherein $\alpha$ is a variable depending on the extent of the unbalance ($0 \leqq \alpha \leqq 0.5$ and $i_0=i_1+i_2$). The difference of input voltage $Va-Vb$ is then represented by $\alpha$ as follows:

$$Va - Vb = \left\{ \frac{kT}{q} \ln \frac{(0.5+\alpha)i_0}{i_s} + r(0.5+\alpha)i_0 \right\} - \left\{ \frac{kT}{q} \ln \frac{(0.5-\alpha)i_0}{i_s} + r(0.5-\alpha)i_0 \right\} = \frac{kT}{q} \ln \left( \frac{0.5+\alpha}{0.5-\alpha} \right) + 2\alpha r i_0 \quad (1)$$

wherein k: Boltzman's constant

T: absolute temperature q: charge of electron $i_s$: inverse saturation current between base and emitter of transistors Q1, Q2.

As the voltage drop Ve in the resistors R1, R2 in case of $Va=Vb$ can be represented as $Ve=ri_0/2$, the equation (1) can be rewritten as:

$$Va - Vb = \frac{kT}{q} \ln \left( \frac{0.5+\alpha}{0.5-\alpha} \right) + 4\alpha Ve \quad (2)$$

By increasing the value of Ve in the equation (2), the second term in the right-hand side becomes sufficiently larger than the first term to obtain a relation $Va-Vb=4\alpha Ve$, namely a linear proportional relation between $Va-Vb$ and $\alpha$. In practice, however, Ve should be lowered to a reasonable value, as a relatively small value of $\alpha$ provides a sufficiently high linearity even when Ve is not sufficiently high.

In the first current mirror circuit constituting a constant current load for the first differential amplifier, the left-hand branch circuit containing the transistor Q3 has a current $(0.5+\alpha)i_0$ to cause the same current in the right-hand branch circuit. However, as the transistor Q2 receiving a base voltage Va only accepts a current equal to $(0.5-\alpha)i_0$, the surplus current is supplied as an output current $i_{out}$ from the terminal c. In this manner the output current $i_{out}$ is obtained by the push-pull function of the transistors Q2 and Q4, and is represented by $i_{out}=(0.5+\alpha)i_0-(0.5-\alpha)i_0=2\alpha i_0$. In this manner the output current $i_{out}$ is proportional to $\alpha$, and is proportional to $Va-Vb$ because of the proportional relationship between $\alpha$ and $Va-Vb$.

In this state the left-hand branch circuit of the second differential amplifier containing the transistor Q1' and resistor R1' has a current $i_2=(0.5-\alpha)i_0$ causing the same currents in the left- and right-hand branch circuits of the second current mirror circuit. The collector current of the transistor Q2', having a base voltage Vb in this state, is $i_2=(0.5+\alpha)i_0$ which is larger than the collector current $(0.5-\alpha)i_0$ of the transistor Q4' in the second current mirror circuit, but there occurs no current flow through the terminal d because of the presence of the diode D', which conducts current only in the opposite direction.

In this manner, in case $Vb>Va$, the first differential amplifier alone functions to provide an output current $i_{out}$, proportional to $Vb-Va$, from the first output terminal c through the diode D to the resistor R3.

Figure 4:
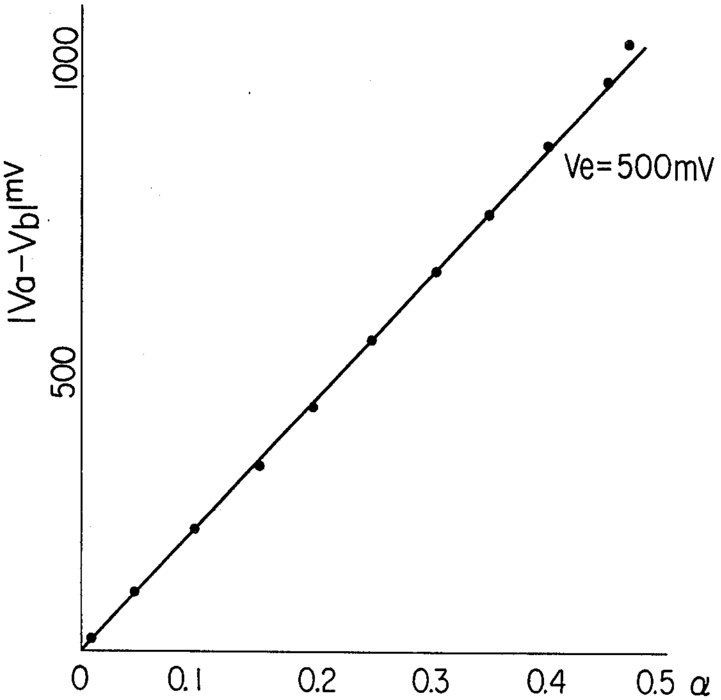
FIG. 4 is a chart showing the measured linearity of the absolute value circuit of the present invention.

On the other hand, in case $Va>Vb$, the second differential amplifier alone functions in the opposite manner to provide an output current $i_{out}$, proportional to $Va-Vb$, from the second terminal d through the diode D' to the resistor R3. Thus, taking the resistance of the resistor R3 as $r_3$ and the voltage of the standard source B as $V_{ref}$, the output voltage $V_{out}$ from the output terminal e of the operational amplifier is represented by:

$$V_{out} = V_{ref} - i_{out} \cdot r_3 = V_{ref} - \frac{i_0 r_3}{2Ve} |Va - Vb|$$

regardless whether $Va>Vb$ or $Vb>Va$, and is therefore proportional to the absolute value $|Va-Vb|$. Operational amplifier OP, resistor R3, and reference voltage $V_{ref}$ constitute a current-voltage converter. FIG. 4 shows a measured relation between $\alpha$ and $Va-Vb$ for $Ve=500$ mV, corresponding to the equation $|Va-Vb|=4\,Ve\alpha$.

Figure 3:
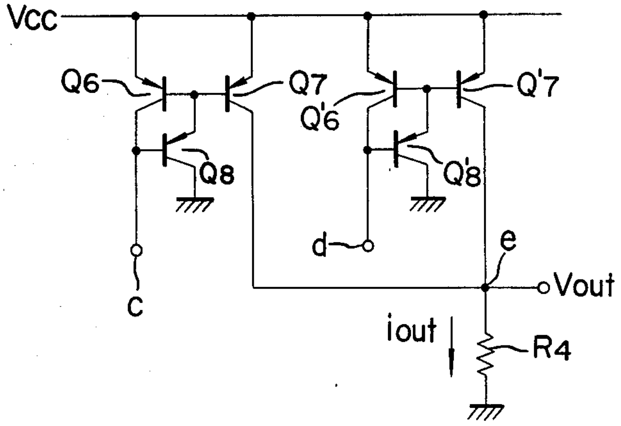
FIG. 3 is a circuit diagram of another embodiment of the uni-directional circuit means employed in the present invention.

Now there will be explained a second embodiment of the present invention shown in FIG. 3, wherein the diodes D, D' and the operational amplifier circuit shown in FIG. 2 are replaced by third and fourth current mirror circuits and a resistor R4. A third current mirror circuit composed of transistors Q6, Q7 and Q8 is connected, in place of the diode D, between the first output terminal c and the power supply line, and a fourth current mirror circuit composed of transistors Q6', Q7' and Q8' is connected, in place of the diode D', between the second output terminal d and said line. The collectors of said transistors Q7, Q7' are mutually connected and grounded through an output resistor R4 of a resistance $r_4$, and the output signal is obtained from the connecting point e of said collectors. Said third and fourth current mirror circuits are in the opposite manner in comparison with the foregoing first embodiment, since the direction of current in said circuits is opposite to that in the diodes D, D'. Thus, in case of $Vb>Va$, the second differential amplifier alone functions to supply the output current $i_{out}$ to the terminal d, while in case of $Va>Vb$ the first differential amplifier alone functions to supply the output current $i_{out}$ to the terminal c. Due to the operation of the current mirror circuits, the currents to the terminals c, d flow through the transistors Q7, Q7' and the resistor R4, which constitutes a current-voltage converter, thus providing an output voltage $V_{out}=i_{out} \cdot r_4$ proportional to $|Va-Vb|$ and therefore constituting an absolute value circuit. In comparison with the foregoing first embodiment, the present second embodiment is advantageous in that it provides a function range $0<V_{out}<V_{cc}-V_{CE(sat)}$ which is wider than the range $0<V_{out}<V_{ref}$ in the first embodiment, thus representing a higher rate of utilization of the power supply voltage, and that the second embodiment requires only one voltage source.

The absolute value circuit of the present invention, providing the output signal in the form of a current, is advantageous in easily permitting the summation of outputs from plural absolute value circuits, by merely connecting plural outputs to the resistor R3 or R4.

Also a condenser connected parallel to the resistor R3 or R4 can be utilized as a smoothing circuit for an AC input signal.

In case the aforementioned rate of utilization of the power supply voltage can be sacrificed or the power supply voltage is sufficiently high, the bipolar transistors shown in the foregoing embodiments may be replaced by other suitable elements.

We claim:

1. An absolute value circuit capable of providing, through an output terminal, a signal corresponding to the absolute value of the difference between a first input signal and a second input signal, comprising:

(a) first circuit means adapted for subtracting a current corresponding to said second input signal from a current corresponding to said first input signal, and for supplying to a first terminal a current corresponding to the result of said subtraction of a first direction in case said result is positive, and for supplying a current corresponding to the result of said subtraction of a second direction opposite to said first direction in case said result is negative;

(b) second circuit means adapted for subtracting a current corresponding to said first input signal from a current corresponding to said second input signal and for supplying to a second terminal a current corresponding to the result of said subtraction of said first direction in case said result is positive, and for supplying a current corresponding to the result of said subtraction of said second direction in case said result is negative; and (c) uni-directional circuit means disposed between said first and second terminals and said output terminal for transmitting current of only a predetermined one of said first and second directions from said first and second circuit means to said output terminal.

2. An absolute value circuit according to claim 1, wherein each of said first and second circuit means comprises a differential amplifier composed of a first amplifier for receiving said first input signal and a second amplifier for receiving said second input signal; and a constant current source for biasing said differential amplifier.

3. An absolute value circuit according to claim 2, wherein each of said first and second circuit means further comprises a current mirror circuit containing a current master circuit and a current slave circuit and functioning as a load to said differential amplifier, wherein the first and second amplifiers of said first circuit means are respectively connected to an associated current master circuit and to an associated current slave circuit, while the second and first amplifiers of said second circuit means are respectively connected to an associated current master circuit and to an associated current slave circuit, thereby achieving a push-pull function by each differential amplifier and its associated current slave circuit.

4. An absolute value circuit according to claim 3, wherein said uni-directional circuit means comprises two uni-directional current circuit elements which are connected at one end thereof respectively to the first and second terminals, the first and second terminals constituting respective junction points between said differential amplifiers and said current slave circuits in said first and second circuit means, said uni-directional current circuit elements being connected in such a manner as to pass current of said predetermined one direction resulting from said push-pull function, and which uni-directional current circuit elements are connected in common at another end.

5. An absolute value circuit according to claim 4, wherein said uni-directional circuit means comprises a current-voltage converter for converting, into a voltage, a current obtained at the common connecting point of said two uni-directional current circuit elements.

6. An absolute value circuit according to claim 3, wherein said uni-directional circuit means comprises two additional current mirror circuits each containing a current master circuit and a current slave circuit, said current master circuits of the additional current mirror circuits being respectively connected to junction points between said differential amplifiers and said first-mentioned current slave circuits in said first and second circuit means in such a manner as to pass current of said predetermined one direction, and said current slave circuits of said two additional current mirror circuits being commonly connected to said output terminal.

* * * * *